(12) United States Patent
Konishi et al.

(10) Patent No.: US 12,094,959 B2
(45) Date of Patent: Sep. 17, 2024

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Kazuya Konishi, Tokyo (JP); Yoichiro Tarui, Tokyo (JP); Hiroki Niwa, Tokyo (JP); Hiroaki Okabe, Tokyo (JP); Hiroshi Watanabe, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 409 days.

(21) Appl. No.: 17/601,433

(22) PCT Filed: May 29, 2019

(86) PCT No.: PCT/JP2019/021252
§ 371 (c)(1),
(2) Date: Oct. 5, 2021

(87) PCT Pub. No.: WO2020/240728
PCT Pub. Date: Dec. 3, 2020

(65) Prior Publication Data
US 2022/0199811 A1 Jun. 23, 2022

(51) Int. Cl.
*H01L 29/16* (2006.01)
*H01L 29/06* (2006.01)
(Continued)

(52) U.S. Cl.
CPC ...... *H01L 29/7395* (2013.01); *H01L 29/1608* (2013.01); *H01L 29/66333* (2013.01)

(58) Field of Classification Search
CPC ............. H01L 29/0696; H01L 29/1608; H01L 29/66068; H01L 29/66333; H01L 29/7395; H01L 29/78; H01L 29/7802
See application file for complete search history.

(56) References Cited

U.S. PATENT DOCUMENTS 5,200,632 A  4/1993  Sakurai
5,264,378 A * 11/1993 Sakurai ............... H01L 29/7395
148/DIG. 135
(Continued)

FOREIGN PATENT DOCUMENTS

CN  102412288 A  4/2012
CN  103703566 A  4/2014
(Continued)

OTHER PUBLICATIONS

Translation of JP 2002246597 A (Year: 2002).*
(Continued)

*Primary Examiner* — Omar F Mojaddedi
(74) *Attorney, Agent, or Firm* — XSENSUS LLP

(57) ABSTRACT

Provided is a technology that suppresses the removal of collector layers in the planarization process while suppressing the snapback phenomenon. A semiconductor device related to a technology disclosed in the present specification includes a drain layer of first conductivity type in a part of a lower surface a drift layer, a plurality of collector layers of second conductivity type in parts of the lower surface of the drift layer, and a dummy layer of the first conductivity type interposed between the plurality of collector layers in parts of the lower surface of the drift layer, in which a width of the dummy layer 3 in a first direction, which is the direction in which the dummy layer is interposed between the plurality of collector layers, is narrower than a width of the drain layer in the first direction.

16 Claims, 15 Drawing Sheets

(51) Int. Cl.
   *H01L 29/66*   (2006.01)
   *H01L 29/739*  (2006.01)
   *H01L 29/78*   (2006.01)

(56) References Cited

U.S. PATENT DOCUMENTS

| | | | |
|---|---|---|---|
| 5,270,230 | A | 12/1993 | Sakurai |
| 2011/0278694 | A1 | 11/2011 | Rahimo et al. |
| 2012/0068220 | A1* | 3/2012 | Kobayashi .......... H01L 29/7397 257/E29.215 |
| 2014/0225126 | A1* | 8/2014 | Aketa ................. H01L 29/7396 257/77 |
| 2016/0343803 | A1 | 11/2016 | Aketa et al. |
| 2017/0040420 | A1* | 2/2017 | Mori ....................... H01L 29/12 |
| 2017/0162564 | A1 | 6/2017 | Aketa et al. |
| 2018/0158915 | A1 | 6/2018 | Mori et al. |
| 2018/0261594 | A1* | 9/2018 | Yamano .............. H01L 29/0649 |
| 2018/0286943 | A1* | 10/2018 | Naito ................. H01L 29/66348 |
| 2018/0331185 | A1 | 11/2018 | Mori et al. |
| 2019/0148369 | A1 | 5/2019 | Aketa et al. |
| 2019/0157381 | A1* | 5/2019 | Naito .................. H01L 29/0696 |
| 2020/0006327 | A1 | 1/2020 | Aketa et al. |

FOREIGN PATENT DOCUMENTS

| | | | |
|---|---|---|---|
| CN | 106463503 | A | 2/2017 |
| JP | 4-3981 | A | 1/1992 |
| JP | 2002246597 | A * | 8/2002 |
| JP | 2003303965 | A * | 10/2003 |
| JP | 2006-019556 | A | 1/2006 |
| JP | 2012-512538 | A | 5/2012 |
| JP | 2013-110373 | A | 6/2013 |
| JP | 2015-207588 | A | 11/2015 |
| WO | 2010/069618 | A1 | 6/2010 |
| WO | 2015/159953 | A1 | 10/2015 |

OTHER PUBLICATIONS

Translation of JP 2003303965 A (Year: 2003).*
Office Action issued Oct. 28, 2023 in Chinese Patent Application No. 201980096756.1 with English translation thereof.
International Search Report and Written Opinion mailed on Aug. 27, 2019, received for PCT Application PCT/JP2019/021252, Filed on May 29, 2019, 10 pages including English Translation.

* cited by examiner

SEMICONDUCTOR DEVICE AND METHOD OF MANUFACTURING SEMICONDUCTOR DEVICE

CROSS-REFERENCE TO RELATED APPLICATION

The present application is based on PCT filing PCT/JP2019/021252, filed May 29, 2019, the entire contents of which are incorporated herein by reference.

TECHNICAL FIELD

The technique disclosed herein relates to a semiconductor device and a method of manufacturing the semiconductor device.

BACKGROUND ART

In recent years, a SiC-IGBT has been proposed in which SiC, which is a wide band gap semiconductor, is applied to an insulated gate bipolar transistor (that is, an IGBT).

According to the above, by using the conductivity modulation peculiar to the bipolar device, a device having a lower resistance than that of the metal-oxide-semiconductor field-effect transistor (MOSFET), which is a unipolar device in the high breakdown voltage region of 10 kV or more is realized.

However, a problem peculiar to the SiC-IGBT has been pointed out that, the rising voltage thereof is 2.9V, which is much higher than the case where Si is applied. Note that when Si is applied, the rising voltage is 0.8V.

Therefore, although the SiC-IGBT has a lower resistance than that of the MOSFET when energized with a large current, the voltage required to reach the energized state is larger than that of the MOSFET when energized with a small current, leading to a great loss.

As a result, the loss of the entire power conversion system cannot be greatly suppressed with the adoption of the SiC-IGBT compared with the adoption of the MOSFET. Therefore, it is necessary to improve the characteristics of the SiC-IGBT in the small current region.

In order to solve the problem, a structure in which an IGBT and a MOSFET are integrated has been proposed. In this structure, the p− type collector layer of the IGBT and the n− type drain layer of the MOSFET being a layer having different conductivity from the p− type collector layer, are formed on the lower surface (rear surface) of the device and the MOSFET operation is performed in the small current region until the rising voltage, and the IGBT operation that allows conductivity modulation is performed in the large current region. Low resistance can be realized in the entire current region thereby.

In order to form two layers having different conductivity on the lower surface (rear surface) of the device, a manufacturing method different from the conventional manufacturing method of the IGBT is required to be used.

For example, in Patent Document 1 and Patent Document 2, a p− type collector layer and an n− type drain layer are formed by implanting p− type ions and n− type ions into desired regions on the lower surface (rear surface) from the lower surface (rear surface) side.

Further, for example, Patent Document 3 discloses a method of forming the layers by epitaxial growth instead of ion implantation, in which the p− type collector layer and the n− type drain layer are formed on the lower surface (rear surface) side using an embedding process.

In the embedding process, specifically, the n− type drain layer is formed, and then, trenches are formed on the n− type drain layer by etching. Then, the p− type collector layer is deposited by epitaxial growth such that the formed trenches are embedded therewith, and the excess p− type collector layer remaining on the n− type drain layer not embedded in the trenches is removed by chemical mechanical polishing (that is, CMP), or the like.

A pattern of the flat p− type collector layer and the n− type drain layer is formed thereby. Then, a drift layer is formed on the upper surface of the p− type collector layer and the upper surface of the n− type drain layer by epitaxial growth. The p− type collector layer and the n− type drain layer are formed by such a method.

Here, the integrated structure of the IGBT and the MOSFET has a problem in terms of peculiar characteristics. Therefore, a design different from that of the conventional IGBT is required therefor.

That is, the rising voltage will increase when the p− type collector layer and the n− type drain layer are simply formed. This is because that the isoelectric lines from the drain potential during MOSFET operation wrap around over the p− type collector layer and this reduces the potential difference at the pn junction between the p− type collector layer and the n− type drift layer; therefore, the IGBT does not turn on even when the normal rising voltage of 2.9V is applied.

As a result, the rising voltage required for the IGBT to turn on increases (snapback phenomenon). In particular, the snapback phenomenon is more prone to occur with SiC having a higher rising voltage than that with conventional Si.

PRIOR ART DOCUMENTS

Patent Documents

[Patent Document 1]] Japanese Patent Application Laid-Open No. 2015-207588

[Patent Document 2]] Japanese Patent Application Laid-Open No. 2013-110373

[Patent Document 3]] Japanese Patent Application Laid-Open No. 2003-303965

SUMMARY

Problem to be Solved by the Invention

In order to realize an integrated structure of an IGBT to which SiC is applied and a MOSFET, there has been a problem in that the rear surface ion implantation method used in the case of conventional Si creates a large amount of implantation defects at the pn junction.

Implantation defects created by ion implantation inhibit hole implantation during on-operation of the IGBT and increase resistance. This is not preferable in terms of characteristics.

Therefore, in order to suppress the creation of implantation defects, the p− type collector layer need to be formed by epitaxial growth.

Meanwhile, the rising voltage is higher when SiC is applied than when Si is applied. In order to suppress the snapback phenomenon when applying SiC, it is necessary to design the width of the p− type collector layer wider than when Si is applied. Therefore, for the integrated structure of the IGBT to which SiC is applied and MOSFET, the wide p− type collector layer and the n− type drain layer are preferably formed through the embedding process in terms of characteristics thereof.

However, the use of the above method for the case of SiC raises a new problem that has not become apparent in the case of conventional Si.

In the planarization process by CMP in the embedding process, due to the wide p− type collector layer embedded in a trench, the aspect ratio of a trench becomes very small; therefore, a grindstone bends in the upper part of the trench and the grindstone comes into contact with the p− type collector layer in some cases.

As a result, the p− type collector layer embedded in the trench is also removed by the curved grindstone. Therefore, the removal of the p− type collector layer in the planarization process in the embedding process is required to be suppressed.

That is, when manufacturing the integrated SiC-IGBT and MOSFET structure using the embedding process, there is a contradiction between the expansion of p− type collector layer width to suppress the snapback phenomenon and the reduction of p− type collector layer width to suppress the p− type collector layer from being removed by polishing in the planarization process.

The technique disclosed in the present specification has been made in view of the above-mentioned problems, and an object is to provide a technique for suppressing the removal of the collector layer in the planarization process while suppressing the snapback phenomenon.

Means to Solve the Problem

A first aspect of the technology disclosed in the present specification includes a drift layer of first conductivity type, a base layer of second conductivity type in a surface layer on an upper surface of the drift layer, a source layer of the first conductivity type in a surface layer of the base layer, a gate insulating film in contact with the base layer interposed between the source layer and the drift layer, a gate electrode in contact with the gate insulating film, an interlayer insulating film covering the gate electrode, an emitter electrode covering an upper surface of the source layer and the interlayer insulating film, a drain layer of the first conductivity type in a part of a lower surface the drift layer, a plurality of collector layers of the second conductivity type in parts of the lower surface of the drift layer, a dummy layer of the first conductivity type interposed between the plurality of collector layers in parts of the lower surface of the drift layer, and a collector electrode that is brought into ohmic contact with the collector layers, in which a width of the dummy layer in a first direction, which is a direction in which the dummy layer is interposed between the plurality of collector layers, is narrower than a width of the drain layer in the first direction.

A second aspect of the technology disclosed in the present specification includes forming a plurality of trenches on an upper surface of a semiconductor substrate of first conductivity type, depositing an impurity layer of second conductivity type on the upper surface of the semiconductor substrate including inside of the plurality of trenches by epitaxial growth of the second conductivity type, removing the impurity layer formed in the region other than the inside of the trenches, in which the impurity layers inside of the trenches represent collector layers, a layer of the first conductivity type interposed between the plurality of trenches represent a dummy layer, and a layer of the first conductivity type on outside of the trenches represent a drain layer, forming a drift layer of the first conductivity type on an upper surface of the semiconductor substrate by epitaxial growth of the first conductivity type, and removing a lower surface of the semiconductor substrate until the collector layers are exposed, in which a width of the dummy layer in a first direction, which is a direction in which the dummy layer is interposed between the plurality of collector layers, is narrower than a width of the drain layer in the first direction.

Effects of the Invention

The first aspect of the technology disclosed in the present specification includes a drift layer of first conductivity type, a base layer of second conductivity type in a surface layer on an upper surface of the drift layer, a source layer of the first conductivity type in a surface layer of the base layer, a gate insulating film in contact with the base layer interposed between the source layer and the drift layer, a gate electrode in contact with the gate insulating film, an interlayer insulating film covering the gate electrode, an emitter electrode covering an upper surface of the source layer and the interlayer insulating film, a drain layer of the first conductivity type in a part of a lower surface the drift layer, a plurality of collector layers of the second conductivity type in parts of the lower surface of the drift layer, a dummy layer of the first conductivity type interposed between the plurality of collector layers in parts of the lower surface of the drift layer, and a collector electrode that is brought into ohmic contact with the collector layers, in which a width of the dummy layer in a first direction, which is a direction in which the dummy layer is interposed between the plurality of collector layers, is narrower than a width of the drain layer in the first direction. According to such a configuration, the removal of the collector layers in the planarization process is suppressed while suppressing the snapback phenomenon.

Further, the second aspect of the technology disclosed in the present specification includes forming a plurality of trenches on an upper surface of a semiconductor substrate of first conductivity type, depositing an impurity layer of second conductivity type on the upper surface of the semiconductor substrate including inside of the plurality of trenches by epitaxial growth of the second conductivity type, removing the impurity layer formed in the region other than the inside of the trenches, in which the impurity layers inside of the trenches represent collector layers, a layer of the first conductivity type interposed between the plurality of trenches represent a dummy layer, and a layer of the first conductivity type on outside of the trenches represent a drain layer, forming a drift layer of the first conductivity type on an upper surface of the semiconductor substrate by epitaxial growth of the first conductivity type, and removing a lower surface of the semiconductor substrate until the collector layers are exposed, in which a width of the dummy layer in a first direction, which is a direction in which the dummy layer is interposed between the plurality of collector layers, is narrower than a width of the drain layer in the first direction. According to such a configuration, the removal of the collector layers in the planarization process is suppressed while suppressing the snapback phenomenon.

The objects, characteristics, aspects, and advantages of the technique disclosed in the present specification will become more apparent from the following detailed description and the accompanying drawings.

DESCRIPTION OF EMBODIMENT(S)

Figure 1:
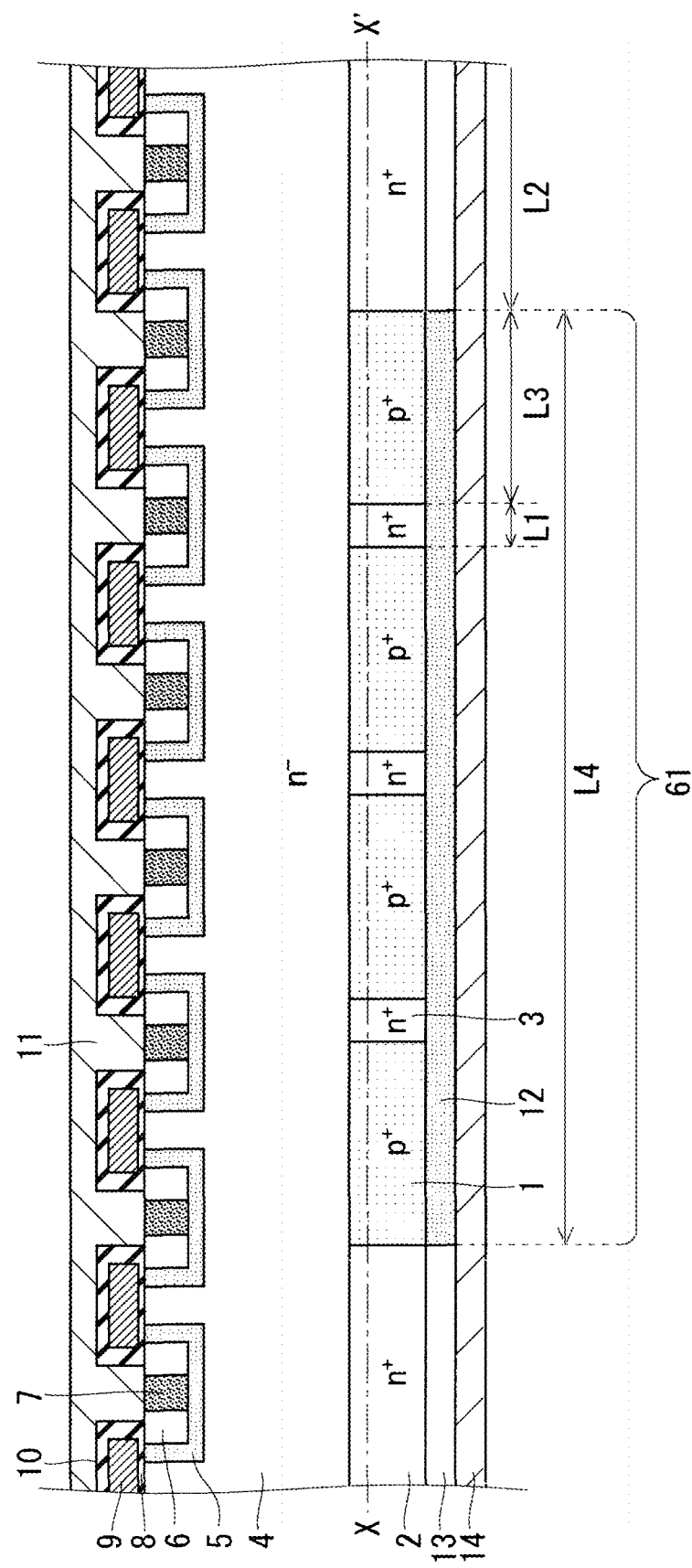
FIG. 1 A cross-sectional view schematically illustrating a configuration example of a semiconductor device according to Embodiment.

Hereinafter, Embodiments will be described with reference to the attached drawings. In the following Embodiments, detailed features and the like are also described for the purpose of explaining the technique; however, they are examples, and not all the features are necessarily essential in order for Embodiments to be feasible.

It should be noted that the drawings are schematically illustrated and, therefore, the configurations are appropriately omitted or simplified in the drawings for facilitating the description. Also, the mutual relationship among sizes and positions in configurations and the like illustrated in different drawings are not necessarily accurately described, and may be changed as appropriate. In addition, in the drawings such as plan views that are not cross-sectional views, hatching may be given to facilitate understanding of the contents of Embodiments.

In addition, in the following description, the same components are denoted by the same reference numerals, and the names and functions thereof are also similar. Accordingly, detailed descriptions thereof may be omitted to avoid redundancy.

Also, in the description written below, when it is described that a certain component is "equipped", "included", or "an object has a certain component", etc., such wording does not exclude the existence of another component.

Also, in the following description, even though ordinal numbers such as "first", and "second" may be used, these terms are for promoting the understanding of the contents of Embodiments and are not for defining the order caused by such ordinal numbers.

Also, in the following description, descriptions representing equivalency such as "Same", "equal", "uniform", "homogeneous" include the case of being an exact equal state and the case where there is a difference within the tolerance or the range where the same function can be obtained, unless otherwise specified.

Also, in the following description, even though terms indicating specific positions and directions such as "upper", "lower", "left", "right", "side", "bottom", "front", and "back" may be used, these terms are for promoting the understanding of the contents of Embodiments and are not related to the directions at the time of implementation.

In addition, in the following description, in a case where "the upper surface of . . . ", "the lower surface of . . . " or the like is described, in addition to the upper surface of the component of interest itself, a state in which other components are formed on the upper surface is also included. That is, for example, when it is described as "B provided on the upper surface of A", it does not preclude the interposition of another component "C" between A and B.

Embodiment 1

Hereinafter, a semiconductor device according to Embodiment 1 and the method of manufacturing the semiconductor device will be described.

Although in the following description, regarding the conductive types of impurities, n– type represents the first conductive type and p– type represents the second conductive type, the definition may be reversed thereof.

Configuration of Semiconductor Device

FIG. 1 is a cross-sectional view schematically illustrating a configuration example of a semiconductor device according to Embodiment 1.

As an example is illustrated in FIG. 1, the semiconductor device according to Embodiment 1 includes an n– type (first conductive type) drift layer 4 made of SiC, p– type (second conductive type) base layers 5 partially formed in the surface layer of the n– type drift layer 4, n– type source layers 6 partially formed on the surface layers of p– type base layers 5, and p– type base contact layers 7 formed from the upper surfaces to the lower surfaces of the n– type source layers 6.

Also as the example is illustrated in FIG. 1, the semiconductor device according to Embodiment 1 includes gate insulating films 8 which is, for example, oxide films formed on the upper surface of the n– type drift layer 4 while exposing parts of the upper surfaces of the n– type source layers 6 and the upper surfaces of the p– type base contact layers 7, gate electrodes 9 formed on the upper surfaces of the gate insulating films 8, interlayer insulating films 10 formed over the gate electrodes 9, and an emitter electrode 11 formed by covering parts of the upper surfaces of the n– type source layers 6, the upper surfaces of the p– type base contact layers 7, and the interlayer insulating films 10.

The gate insulating film 8 contacts the upper surface of the p− type base layer 5 interposed between the n− type source layer 6 and the n− type drift layer 4.

Also as the example is illustrated in FIG. 1, the semiconductor device according to Embodiment 1 includes a plurality of p+ type collector layers 1 formed on the lower surface of the n− type drift layer 4, n+ type dummy layers 3 formed by being interposed between a plurality of p+ type collector layers 1 on the lower surface of the n− type drift layer 4, and n+ type drain layers 2 formed on the lower surface of the n− type drift layer 4.

Also as the example is illustrated in FIG. 1, the semiconductor device according to Embodiment 1 includes a p− type silicide layer 12 formed on the lower surfaces of the p+ type collector layers 1 and the lower surfaces of the n+ type dummy layers 3, n− type silicide layers 13 formed on the lower surface of the n+ type drain layers 2, and a collector electrode 14 formed on the lower surface of the p− type silicide layer 12 and the lower surfaces of the n− type silicide layers 13.

Here, the width L1 of the n+ type dummy layer 3 is narrower than the width L2 of the n+ type drain layer 2. Also, the n+ type dummy layers 3 are not brought into ohmic contact with the collector electrode 14.

Figure 2:
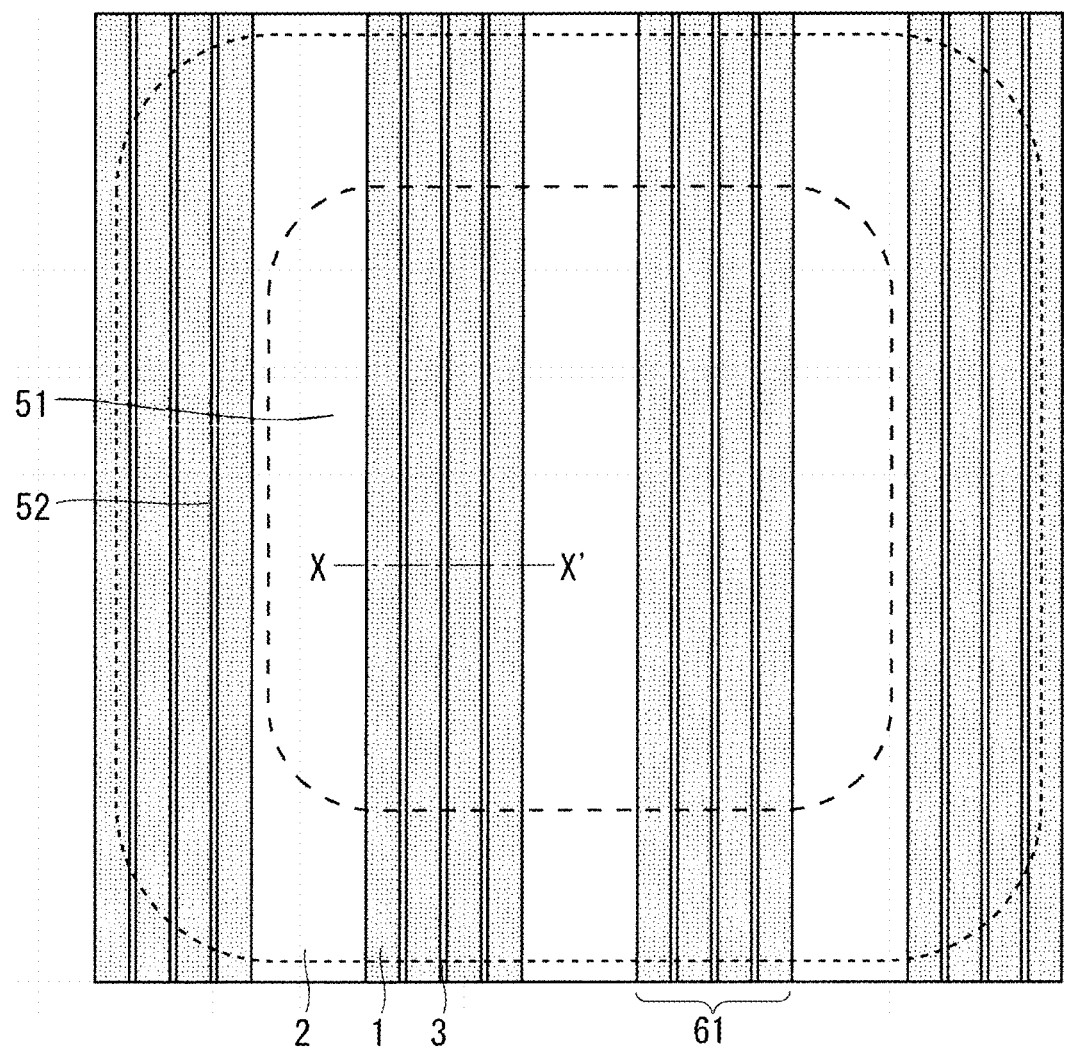
FIG. 2 A plan view schematically illustrating the configuration example of the semiconductor device according to Embodiment.

FIG. 2 is a plan view schematically illustrating a configuration example of the semiconductor device according to Embodiment 1. Here, FIG. 1 corresponds to the X-X' cross section in FIG. 2.

As an example is illustrated in FIG. 2, the semiconductor device according to Embodiment 1 includes an active region 51 and a terminal region 52 that surrounds the active region 51 in plan view.

In the active region 51, structure groups 61 in which the p+ type collector layers 1 and the n+ type dummy layer 3 are alternately arranged, and the n+ type drain layers 2 are alternately arranged.

In the terminal region 52, the structure groups 61 and the n+ type drain layers 2 or the structure groups 61 and the n+ type drain layers 2 are arranged.

In FIG. 2, although an example in which the structure groups 61 and the n+ type drain layers 2 are arranged in a stripe shape, the arrangement mode of the structure groups 61 and the n+ type drain layers 2 is not limited thereto.

Figure 3:
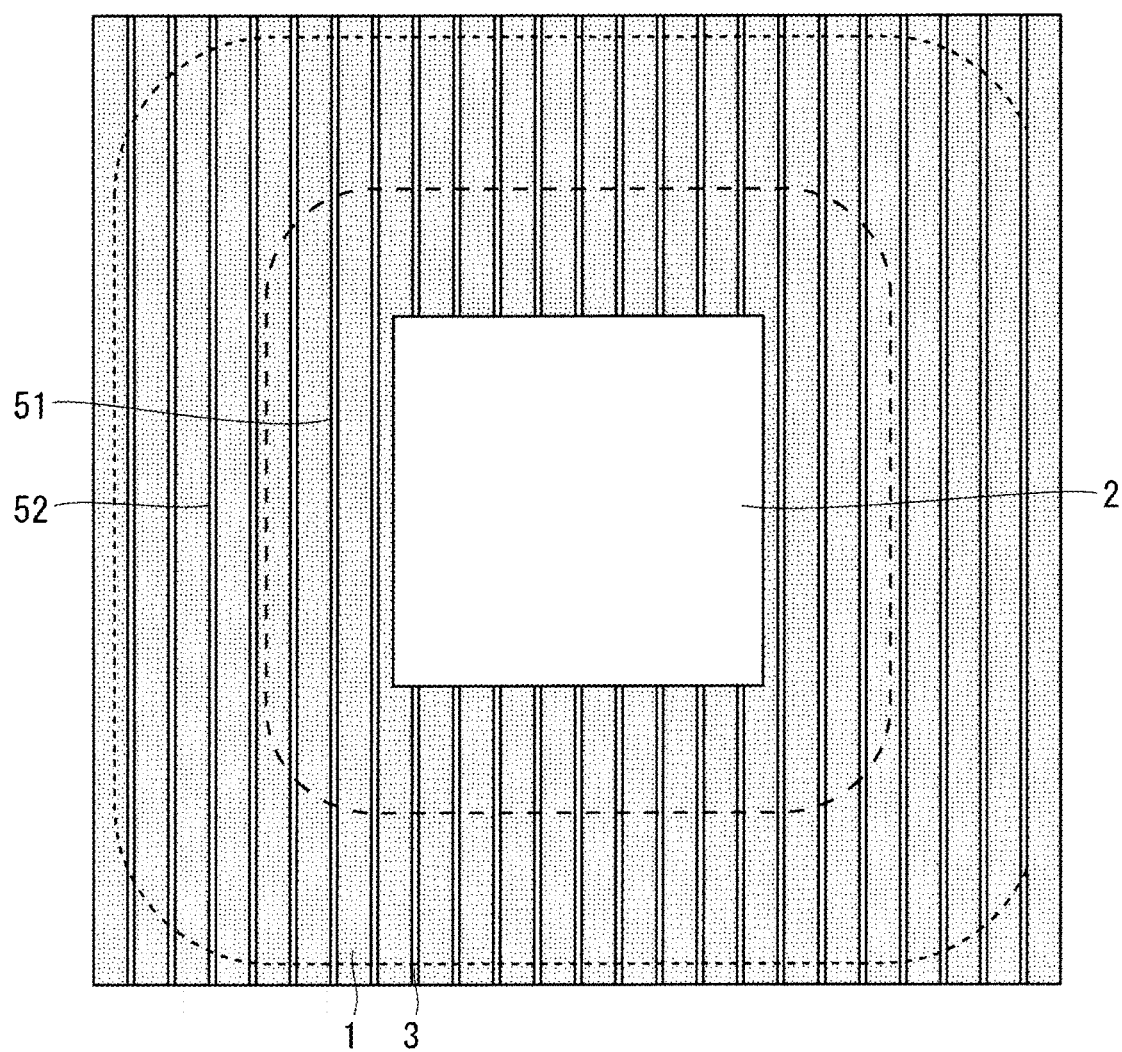
FIG. 3 A plan view schematically illustrating the configuration example of the semiconductor device according to Embodiment.

FIG. 3 is a plan view schematically illustrating a configuration example of the semiconductor device according to Embodiment 1. As an example is illustrated in FIG. 3, the n+ type drain layer 2 may be arranged in a grid pattern so as to be surrounded by the structure group 61. Further, the reversed arrangement being a grid-like arrangement in which the structure group 61 is surrounded by the n+ type drain layer 2 may also be adopted.

In FIG. 1, the width L1 of the n+ type dummy layer 3 need only be narrower than the width L2 of the n+ type drain layer 2, and is, for example, in the range of 2 μm or more and 50 μm or less.

If the width L1 of the n+ type dummy layer 3 is narrower than 2 the mechanical strength thereof becomes weak, and the n+ type dummy layer 3 may possibly be broken by the mechanical stress in the planarization process. On the other hand, if the width L1 of the n+ type dummy layer 3 is wider than 50 the proportion of the n+ type dummy layer 3 which is a region through which no carriers flow increases, so that the resistance increases.

The width L2 of the n+ type drain layer 2 is, for example, 50 μm or more. Here, if L2 of the n+ type drain layer 2 is narrower than 50 μm, the region through which the electron current flows becomes small, so that the resistance during the ON operation of the MOSFET increases.

The range of the width L3 of the p+ type collector layer 1 is, for example, 2 μm or more and 300 μm or less, and preferably 2 μm or more and 100 μm or less.

Note, in FIG. 1, the width L1 of the n+ type dummy layer 3 is narrower than the width L3 of the p− type collector layer 1.

Here, if the width L3 of the p+ type collector layer 1 is narrower than 2 μm, the p+ type collector layer 1 has a high aspect ratio, making forming and embedding the p+ type collector layer 1 by epitaxial growth difficult to perform. On the other hand, if the width L3 of the p+ type collector layer 1 is wider than 300 μm the p+ type collector layer 1 has a low aspect ratio, leading to the possible removal of the p+ type collector layer 1 by polishing in the planarization process.

The width L4 of the structure group 61 is, for example, 100 μm or more. Here, if the width L4 of the structure group 61 is narrower than 100 it is prone to be affected by the electron current from the n+ type drain layer 2 and the snapback phenomenon may occur.

The area ratio of the n+ type drain layers 2 to the structure group 61 is, for example, in the range of 2:8 to 8:2. If the above area ratio is smaller than 2:8, the resistance during MOSFET operation becomes high. On the other hand, if the above area ratio is larger than 8:2, the resistance of the IGBT becomes high. Therefore, the operation of both the IGBT and the MOSFET is difficult to realize.

Manufacturing Method of Semiconductor Device

Next, a manufacturing method of the semiconductor device according to Embodiment 1 will be described with reference to FIG. 4 to FIG. 8. FIGS. 4, 5, 6, and 7 are cross-sectional views illustrating an example of the manufacturing processes of the semiconductor device according to Embodiment 1.

Figure 4:
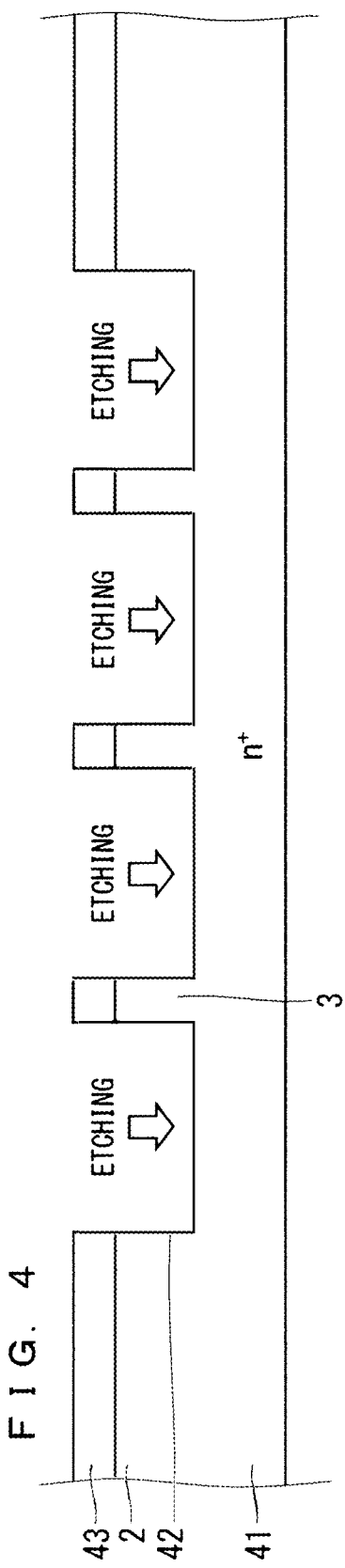
FIG. 4 A cross-sectional view illustrating an example of a manufacturing process of the semiconductor device according to Embodiment.

First, as illustrated in FIG. 4, an n+ type semiconductor substrate 41 made of SiC is subjected to the etching treatment on predetermined regions on the upper surface thereof. Then, a plurality of trenches 42 are formed. The etching treatment is performed through a mask 43 in order to etch the predetermined regions. As the mask 43, for example, a resist or an oxide film is used.

The unetched regions between the trenches 42 formed by the above etching treatment are the n+ type dummy layers 3, and the regions on the outside of the trenches 42 are the n+ type drain layers 2.

The depth of the trench 42 is, for example, in the range of 10 μm or more and 40 μm or less. The range of the width L2 of the trench 42 is, for example, 2 μm or more and 300 μm or less, and preferably 2 μm or more and 200 μm or less.

Figure 5:
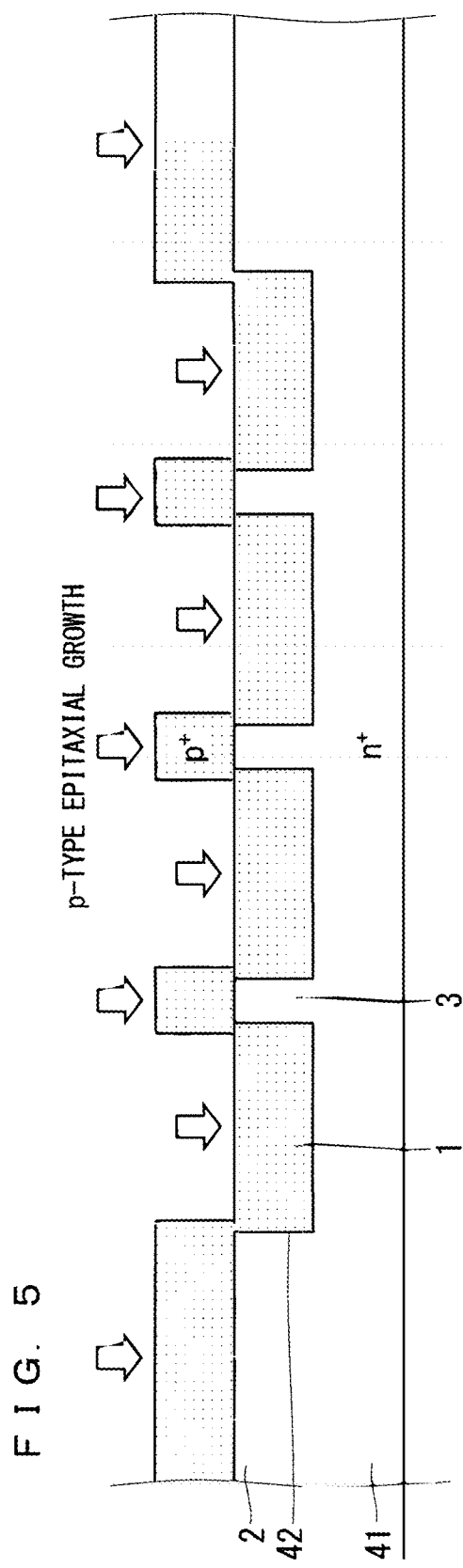
FIG. 5 A cross-sectional view illustrating the example of a manufacturing process of the semiconductor device according to Embodiment.

Next, as illustrated in FIG. 5, the p+ type collector layers 1 are deposited in the trenches 42 and on the upper surface of the n+ type semiconductor substrate 41 by p− type epitaxial growth. The thickness of the p+ type collector layer 1 is, for example, 20 μm or more and 50 μm or less. The impurity concentration of the p+ type collector layer 1 is, for example, in the range of $1 \times 10^{18}$ cm-3 or more and $5 \times 10^{19}$ cm-3 or less.

Figure 6:
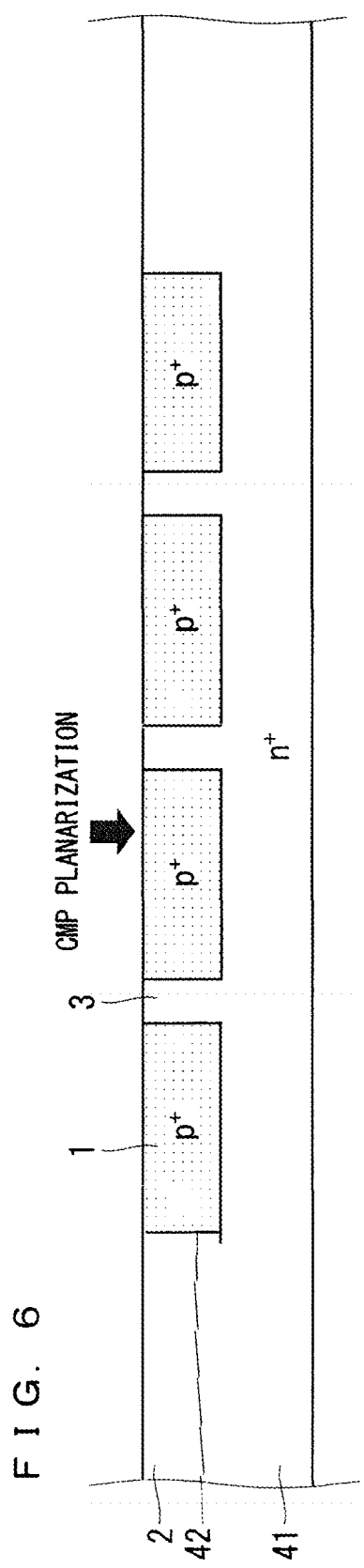
FIG. 6 A cross-sectional view illustrating the example of a manufacturing process of the semiconductor device according to Embodiment.

Next, as illustrated in FIG. 6, the excess p+ type collector layer 1 that is not embedded in the trenches 42 by CMP or the like is polished and removed.

Figure 7:
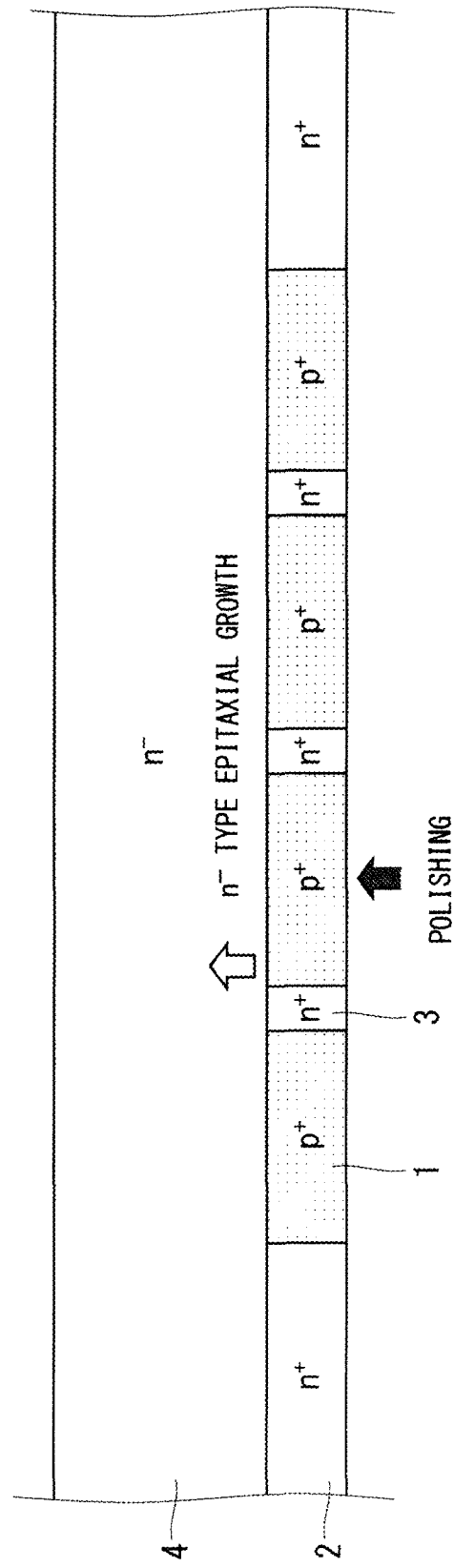
FIG. 7 A cross-sectional view illustrating the example of a manufacturing process of the semiconductor device according to Embodiment.

Next, as illustrated in FIG. 7, an n− type drift layer 4 is formed on the upper surfaces of the p+ type collector layers 1, the upper surfaces of the n+ type drain layers 2, and the upper surfaces of the n+ type dummy layers 3 by the n– type epitaxial growth. The thickness of the n– type drift layer 4 is, for example, 60 µm or more and 300 µm or less. The impurity concentration of the n– type drift layer 4 is, for example, in the range of 1×1014 cm−3 or more and 1×1015 cm−3 or less.

Next, the lower surface of the n+ type semiconductor substrate 41 is polished and removed until the p+ type collector layers 1 are exposed.

Next, predetermined regions on the upper surface of the n– type drift layer 4 is subjected to an ion implantation treatment. The p– type base layers 5, the n– type source layers 6 and the p– type base contact layers 7 are formed thereby as illustrated in FIG. 1 as an example.

The ion implantation treatment is performed through an implantation mask in order to implant ions into predetermined regions. As the implantation mask 43, for example, a resist or an oxide film is used.

Examples of the impurity element used in the ion implantation treatment include phosphorus and nitrogen in order to realize the n– type, and aluminum and boron, for example, in order to realize the p– type.

In the above ion implantation treatment, a part or all of the treatment is performed in the condition where the temperature of the n– type drift layer 4 is set in the range of, for example, 10° C. or higher and 1000° C. or lower, preferably 100° C. or higher and 600° C. or less. The implantation defects occurring at the time of ion implantation can be recovered to some extent thereby.

Next, gate insulating films 8 are formed by thermally oxidizing the above configuration in an oxygen atmosphere. The thickness of the gate insulating film 8 is, for example, in the range of 10 nm or more and 100 nm or less.

Subsequently, gate electrodes 9 are formed as deposited films in the predetermined regions of the gate insulating films 8. Subsequently, a part of the gate electrodes 9 and the gate insulating films 8 are removed, and interlayer insulating films 10 are formed as deposited films on the upper surface and the side surface of the gate electrodes 9. After that, the emitter electrode 11 covering parts of the upper surface of the n– type source layers 6, the upper surface of the p– type base contact layers 7, and the interlayer insulating films 10 is formed.

As the interlayer insulating film 10, for example, TEOS or the like is used. The emitter electrode 11 is made of, for example, aluminum, titanium, nickel, gold, silver, copper, an alloy thereof, or a laminated structure thereof.

The emitter electrode 11 is formed by, for example, an electron beam deposition method or a sputtering method. The emitter electrode 11 is brought into ohmic contact with the n– type source layers 6 and the p– type base contact layers 7, respectively.

The p– type silicide layer 12 is formed on the lower surfaces of the p+ type collector layers 1 and the lower surfaces of the n+ type dummy layers 3. The material of the p– type silicide layer 12 is, for example, aluminum or titanium.

Subsequently, the n– type silicide layers 13 formed on the lower surface of the n+ drain layers 2. The material of the n– type silicide layer 13 is, for example, nickel.

Finally, the collector electrode 14 is formed on the lower surface of the p– type silicide layer 12 and the lower surfaces of the n– type silicide layers 13. The material and forming method of the collector electrode are the same as those of the emitter electrode 11.

The p+ type collector layers 1 are brought into ohmic contact with the collector electrode 14 via the p– type silicide layer 12. The n+ type drain layers 2 are brought into ohmic contact with the collector electrode 14 via the n– type silicide layers 13. Meanwhile, the n+ type dummy layers 3 are not brought into ohmic contact with the collector electrode 14.

Insulating layers may be formed between the n+ type dummy layers 3 and the collector electrode 14 in order to prevent ohmic contact therebetween.

Figure 8:
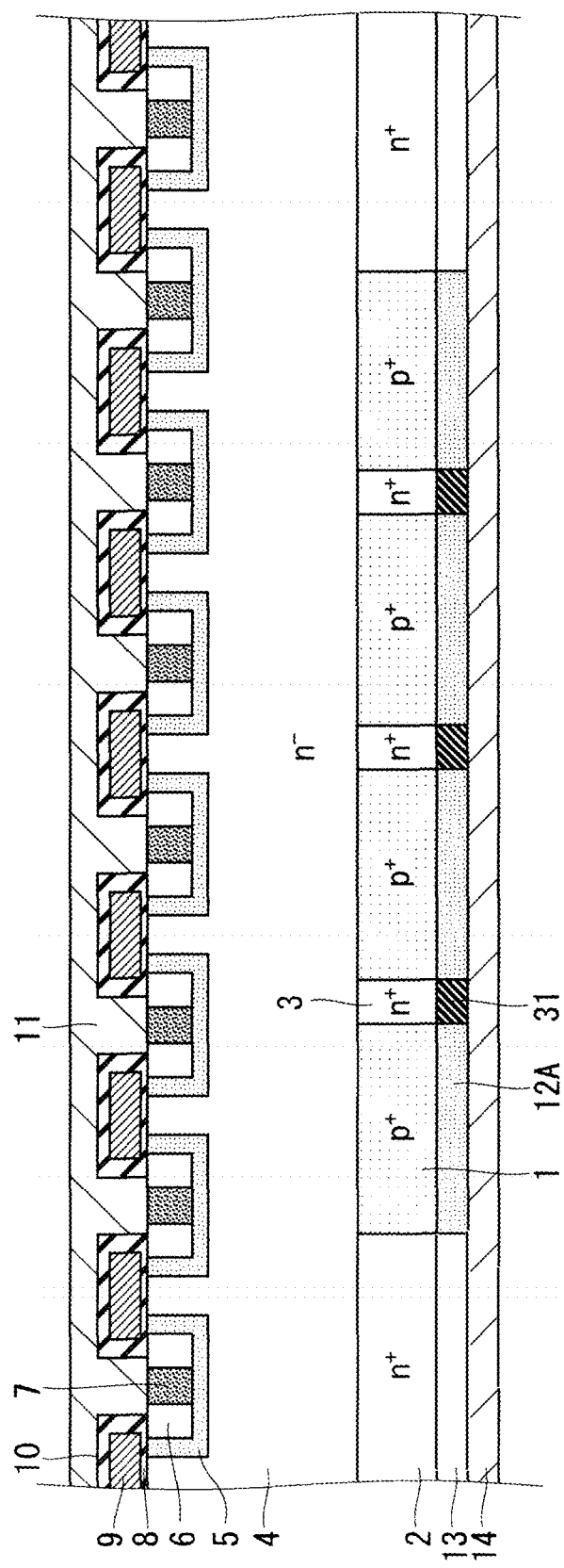
FIG. 8 A cross-sectional view schematically illustrating another configuration example of a semiconductor device according to Embodiment.

FIG. 8 is a plan view schematically illustrating a configuration example of the semiconductor device according to Embodiment 1.

As an example is illustrated in FIG. 8, the semiconductor device according to Embodiment 1 includes the n– type drift layer 4, the p– type base layers 5, the n– type source layers 6, the p– type base contact layers 7, the gate insulating films 8, the gate electrodes 9, the interlayer insulating films 10, the emitter electrode 11, the p+ type collector layers 1, n+ type dummy layers 3, n+ type drain layers 2, p– type silicide layers 12A formed on the lower surfaces of the p+ type collector layers 1, the n– type silicide layers 13, insulating layers 31 formed on the lower surfaces of the n+ type dummy layers 3, and the collector electrode 14 formed on the lower surfaces of the p– type silicide layers 12A, the lower surfaces of the insulating layers 31, and the lower surfaces of the n– type silicide layers 13. Examples of the material of the insulating layer 31 include a silicon oxide film.

According to the semiconductor device according to Embodiment 1, the suppression of the p+ type collector layers 1 epitaxially grown in the embedding process from being removed by polishing is ensured.

As illustrated in FIG. 5, by providing the n+ type dummy layer 3, the aspect ratio of the trench 42 is increased, and the grindstone is less prone to be curved at the upper part of the trench 42. Therefore, the contact between the grindstone and the p+ type collector layers 1 embedded in the trenches 42 can be suppressed, the suppression of the p+ type collector layers 1 from being removed by polishing is ensured.

Also, the n+ type dummy layers 3 are not brought into ohmic contact with the collector electrode 14. Therefore, when a voltage is applied to the n+ type drain layers 2, no voltage is applied to the n+ type dummy layers 3, and from the n+ type dummy layers 3, no isoelectric lines that reduce the potential difference extend to the pn junctions of the p+ type collector layers 1. Accordingly, the snapback phenomenon is suppressed with the arrangement of the n+ type dummy layers 3.

Therefore, the suppression of the p+ type collector layers 1 epitaxially grown in the embedding process from being removed by polishing is ensured, enabling to provide the integrated structure of a low resistance IGBT and a MOSFET.

Embodiment 2

Hereinafter, a semiconductor device according to Embodiment 2 and a method of manufacturing the semiconductor device will be described. In the following description, components similar to the components described in Embodiment 1 will be denoted by the same reference numerals, and detailed description thereof will be omitted as appropriate.

Configuration of Semiconductor Device

Figure 9:
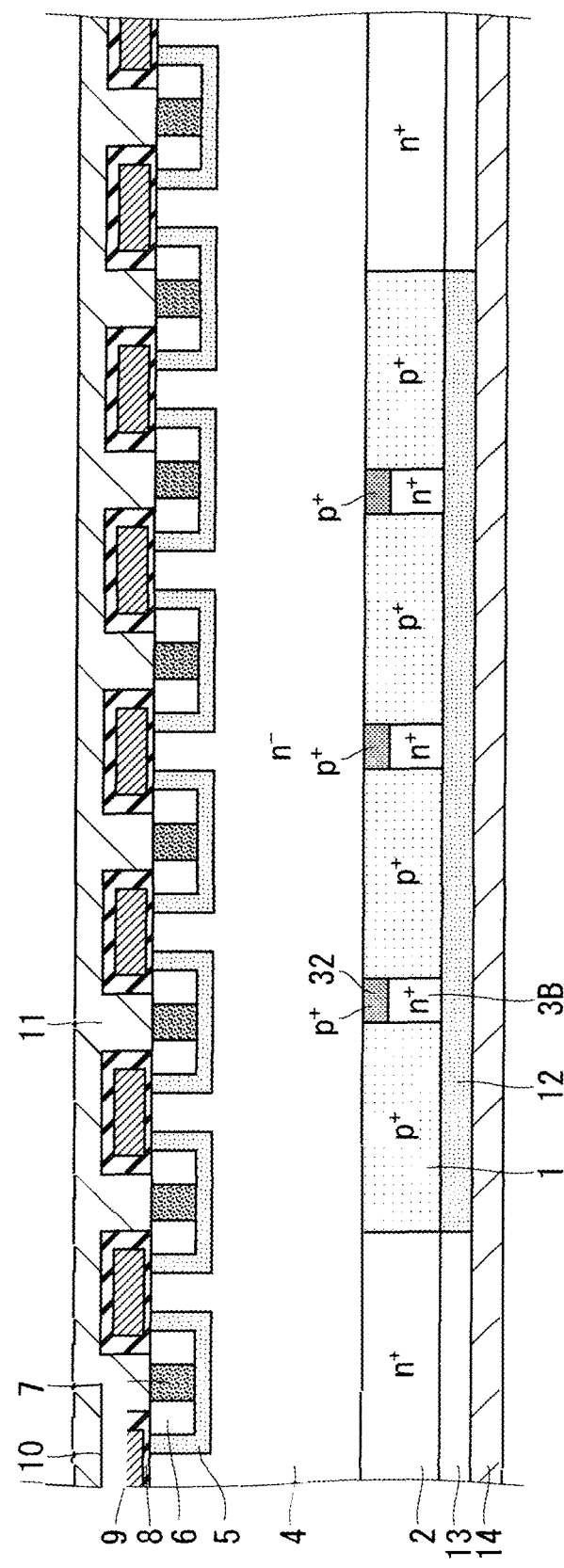
FIG. 9 A cross-sectional view schematically illustrating a configuration example of a semiconductor device according to Embodiment.

FIG. 9 is a cross-sectional view schematically illustrating a configuration example of a semiconductor device according to Embodiment 2.

As an example is illustrated in FIG. 9, the semiconductor device according to Embodiment 2 includes the n− type drift layer 4, the p− type base layers 5, the n− type source layers 6, the p− type base contact layers 7, the gate insulating films 8, the gate electrodes 9, the interlayer insulating films 10, the emitter electrode 11, the p+ type collector layers 1, p− type separation layers 32 formed between the p+ type collector layers 1 on the lower surface of the n− type drift layer 4, n+ type dummy layers 3B formed on the lower surfaces of the p− type separation layers 32, the n+ type drain layers 2, a p− type silicide layer 12, the n− type silicide layers 13, and the collector electrode 14.

The thickness of the p− type separation layer 32 is, for example, 0.1 μm or more and 5.0 μm or less. The impurity concentration of the p− type separation layer 32 is, for example, in the range of 1×1018 cm-3 or more and 1×1021 cm-3 or less.

Manufacturing Method of Semiconductor Device

Figure 10:
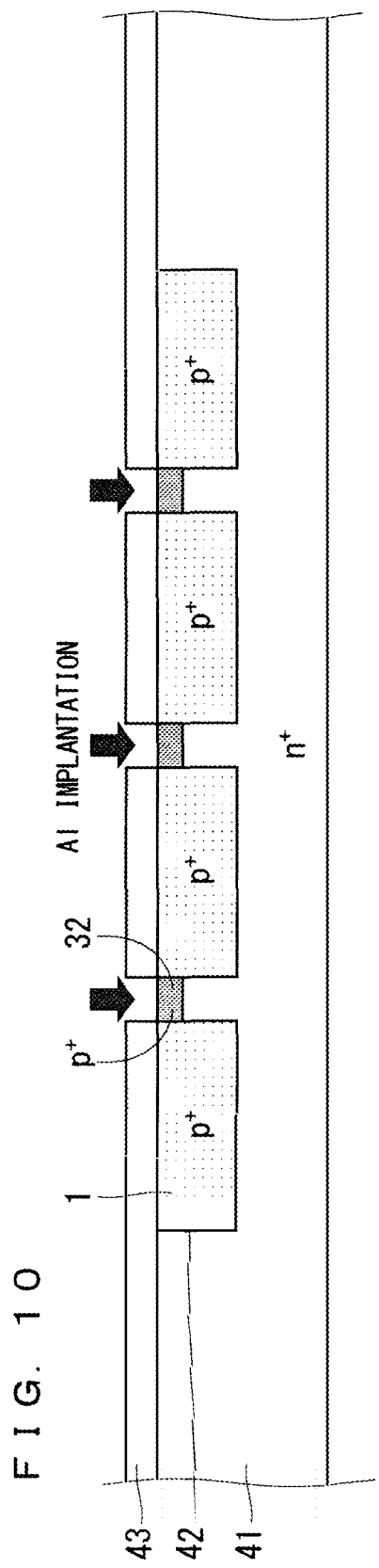
FIG. 10 A cross-sectional view illustrating an example of a manufacturing process of the semiconductor device according to Embodiment.

Next, a manufacturing method of the semiconductor device according to Embodiment 2 will be described with reference to FIG. 10. FIG. 10 is a cross-sectional view illustrating an example of a manufacturing process of the semiconductor device according to Embodiment 2.

After the planarization process of FIG. 6 in Embodiment 1 is performed, a mask 43 is selectively formed on the upper surface of the p+ type collector layers 1 and the upper surface of the n+ type drain layers 2. Then, by performing the p− type ion implantation treatment, the p− type separation layers 32 are formed on the upper surface of the n+ type dummy layers 3B.

Next, the mask 43 is removed, and the processes from FIG. 7 onward in Embodiment 1 are performed. Examples of the impurity element used in the ion implantation treatment include aluminum and boron.

According to the semiconductor device according Embodiment 2, the p− type separation layers 32 are provided between the n+ type dummy layer 3B and the n− type drift layer 4; therefore, the snapback phenomenon is suppressed with the arrangement of the n+ type dummy layers 3B. Therefore, the integrated structure of a low resistance IGBT and a MOSFET can be provided.

Also, p− type separation layers may be formed on the lower surfaces of n+ type dummy layers.

Figure 11:
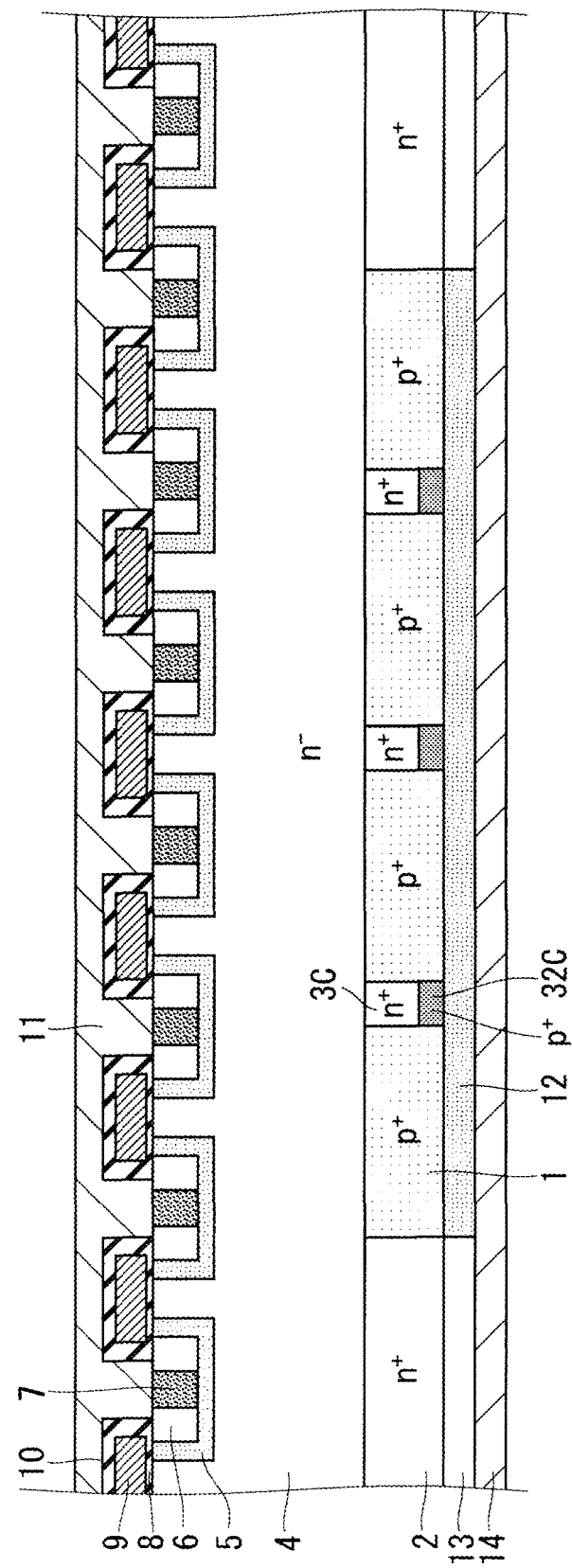
FIG. 11 A cross-sectional view schematically illustrating another configuration example of the semiconductor device according to Embodiment.

FIG. 11 is a cross-sectional view schematically illustrating another configuration example of the semiconductor device according to Embodiment 2.

As an example is illustrated in FIG. 11, the semiconductor device according to Embodiment 2 includes the n− type drift layer 4, the p− type base layers 5, the n− type source layers 6, the p− type base contact layers 7, the gate insulating films 8, the gate electrodes 9, the interlayer insulating films 10, the emitter electrode 11, the p+ type collector layers 1, n+ type dummy layers 3C formed by being interposed between the p+ type collector layers 1 on the lower surface of the n− type drift layer 4, p− type separation layers 32C formed on the lower surfaces of the n+ type dummy layers 3C, the n+ type drain layers 2, the p− type silicide layer 12, the n− type silicide layers 13, and the collector electrode 14.

Figure 12:
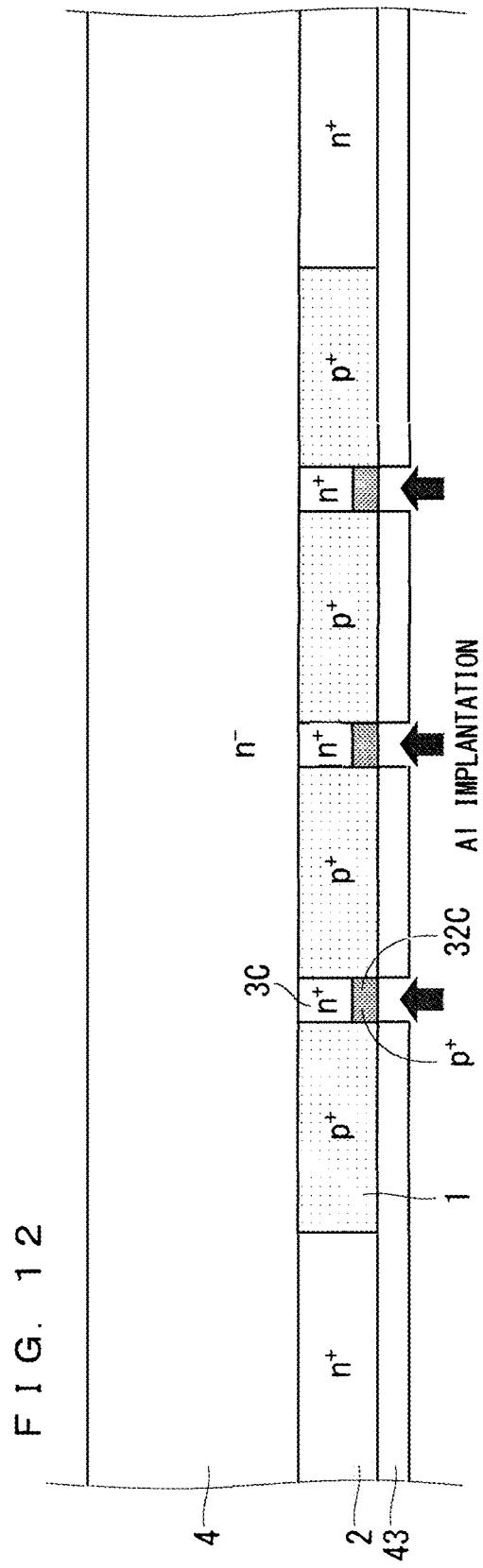
FIG. 12 A cross-sectional view illustrating an example of a manufacturing process of the semiconductor device illustrated in FIG. 11.

A manufacturing method of the semiconductor device according to Embodiment 2 illustrated in FIG. 11 will be described with reference to FIG. 11. Note, FIG. 12 is a cross-sectional view illustrating an example of a manufacturing process of the semiconductor device illustrated in FIG. 11.

First, as illustrated in FIG. 7 of Embodiment 1, after the lower surface of the n+ type semiconductor substrate 41 is polished and removed, the mask 43 is formed on the lower surfaces of the p+ type collector layers 1 and the n+ type drain layers 2. Then, by performing the p− type ion implantation treatment on the n+ type dummy layers from the lower surface side, the p− type separation layers 32C are formed on the lower surfaces of the n+ type dummy layers 3C.

This allows the p− type separation layers 32C to be formed on the lower surfaces of the n+ type dummy layers 3C; therefore, the snapback phenomenon is suppressed with the arrangement of the n+ type dummy layers 3C. Therefore, the integrated structure of a low resistance IGBT and a MOSFET can be provided.

Embodiment 3

Hereinafter, a semiconductor device according to Embodiment 3 and a method of manufacturing the semiconductor device will be described. In the following description, components similar to the components described in Embodiments 1 and 2 will be denoted by the same reference numerals, and detailed description thereof will be omitted as appropriate.

Configuration of Semiconductor Device

Figure 13:
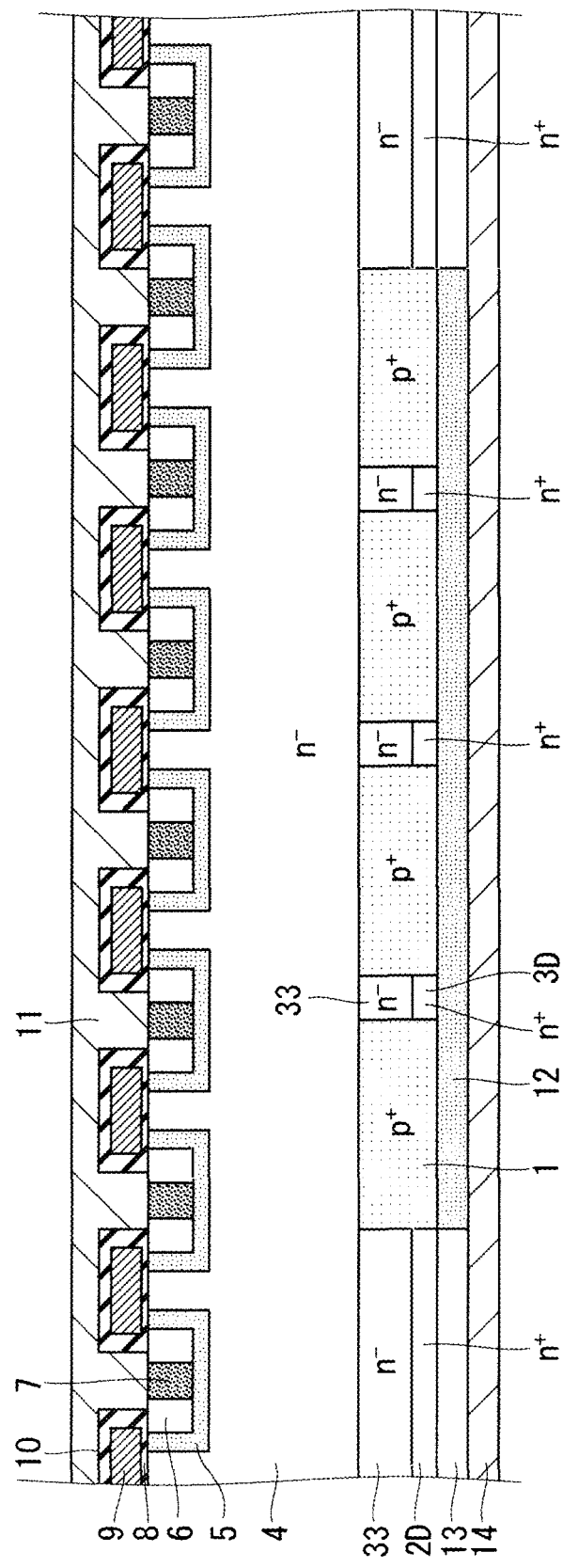
FIG. 13 A cross-sectional view schematically illustrating a configuration example of a semiconductor device according to Embodiment.

FIG. 13 is a cross-sectional view schematically illustrating a configuration example of the semiconductor device according to Embodiment 3.

As an example is illustrated in FIG. 13, the semiconductor device according to Embodiment 3 includes the n− type drift layer 4, the p− type base layers 5, the n− type source layers 6, the p− type base contact layers 7, the gate insulating films 8, the gate electrodes 9, the interlayer insulating films 10, the emitter electrode 11, the p+ type collector layers 1, and further includes, below the lower surface of the n− type drift layer 4, n− type impurity layers 33 formed at the positions interposed between the p+ type collector layers 1 and the positions on the outside of the p+ type collector layers 1 (the position not interposed between the p+ type collector layers 1), n+ type dummy layers 3D formed on the lower surfaces of the n− type impurity layers 33 located positions interposed between the p+ type collector layers 1, n+ type drain layers 2D formed at the positions on the outside of the p+ type collector layers 1 (the position not interposed between the p+ type collector layers 1) on the lower surfaces of the n− type impurity layers 33, the p− type silicide layer 12 formed on the lower surfaces of the p+ type collector layers 1 and the lower surfaces of the n+ type dummy layers 3D, the n− type silicide layers 13 formed on the lower surface of the n+ type drain layers 2D, and the collector electrode 14.

The thickness of the n− type impurity layer 33 is, for example, 2 μm or more and 30 μm or less. The impurity concentration of the n− type impurity layer 33 is, for example, in the range of 1×1014 cm-3 or more and 1×1015 cm-3 or less. The impurity concentration of the n− type impurity layer 33 is lower than the impurity concentration of the n+ type dummy layer 3D.

Manufacturing Method of Semiconductor Device

Figure 14:
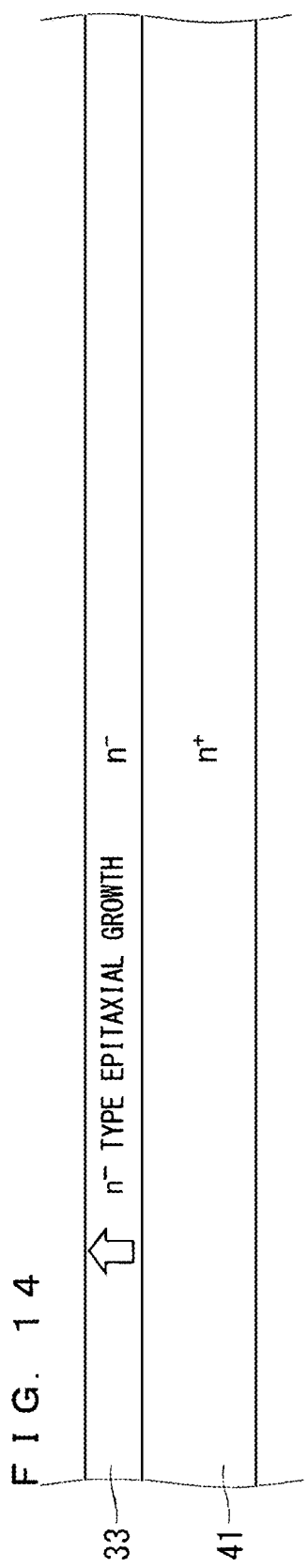
FIG. 14 A cross-sectional view illustrating an example of a manufacturing process of the semiconductor device according to Embodiment.
Figure 15:
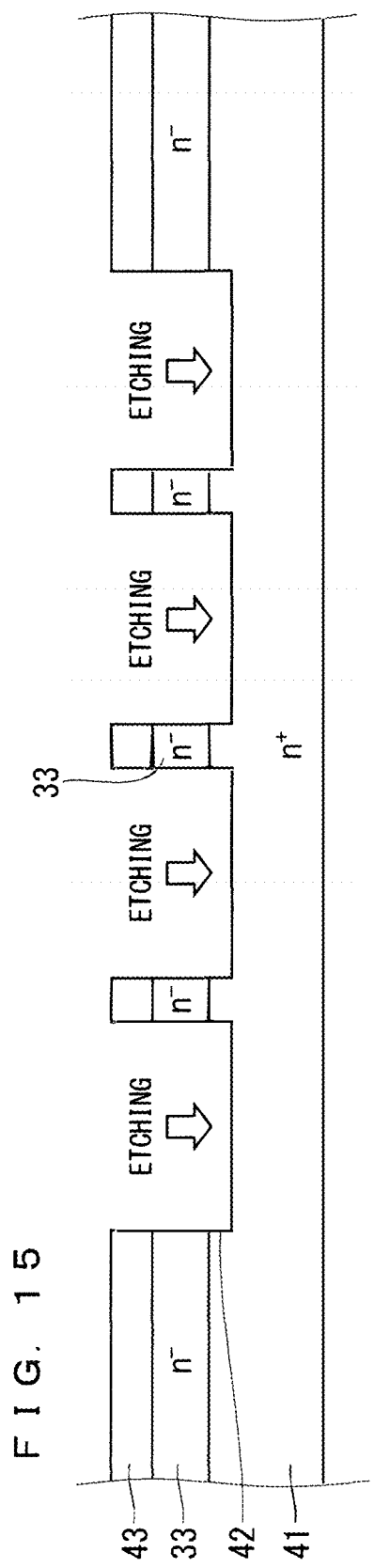
FIG. 15 A cross-sectional view illustrating the example of a manufacturing process of the semiconductor device according to Embodiment.

Next, a manufacturing method of the semiconductor device according to Embodiment 3 will be described with reference to FIGS. 14 and 15. FIGS. 14 and 15 are cross-sectional views illustrating an example of manufacturing processes of the semiconductor device according to Embodiment 3.

First, the n− type impurity layer 33 is formed on the upper surface of the n+ type semiconductor substrate 41 by epitaxial growth. Subsequently, the processes from FIG. 4 onward in Embodiment 1 are performed.

The semiconductor device according to Embodiment 3, the depletion layer extends from the junction between the p+ type collector layer 1 and the n− type impurity layer 33, and the n− type impurity layer 33 is depleted. Accordingly, the snapback phenomenon is suppressed with the arrangement of the n+ type dummy layers 3D. Therefore, the integrated structure of a low resistance IGBT and a MOSFET can be provided.

Effect of Embodiments Described Above

Next, examples of the effect produced by above Embodiments will be described. Although in the following description, the effect is described based on the specific configurations illustrated in Embodiments described above, those examples may be replaced with other specific configurations illustrated in the present specification to the extent that the same effect is produced.

Further, the replacement may be made across a plurality of Embodiments. That is, any case that produces the same effect by combining configurations illustrated in different Embodiments may also be adopted.

According to Embodiment described above, the semiconductor device includes the n− type drift layer 4 of the first conductivity type (n− type), the p− type base layers 5 of the second conductivity type (p− type), the n− type source layers 6, the gate insulating films 8, the gate electrodes 9, the interlayer insulating films 10, the emitter electrode 11, the n+ type drain layers 2, the p+ type collector layers 1, n+ type dummy layers 3, and the collector electrode 14. The p− type base layer 5 is formed in the surface layer of the upper surface of the n− type drift layer 4. The n− type source layer 6 is formed in the surface layer of the p− type base layer 5. The gate insulating film 8 contacts the p− type base layer 5 interposed between the n− type source layer 6 and the n− type drift layer 4. The gate electrode 9 contacts the gate insulating films 8. The interlayer insulating film 10 covers the gate electrode 10. The emitter electrode 11 covers the upper surface of the n− type source layers 6 and the interlayer insulating films 10. The n+ type drain layers 2 are formed on parts of the lower surface of the n− type drift layer 4. The p+ type collector layers 1 are formed on parts of the lower surface of the n− type drift layer 4. The n+ type dummy layers 3 are interposed between a plurality of p+ type collector layers 1 on parts of the lower surface of the n− type drift layer 4. The collector electrode 14 is brought into ohmic contact with the p+ type collector layers 1. The width L1 of the n+ type dummy layer 3 in the first direction, which is the direction in which the dummy layers 3 are interposed between the plurality of p+ type collector layers 1, is narrower than the width L2 of the n+ type drain layer 2 in the first direction.

According to such a configuration, the removal of the p− type collector layer in the planarization process is suppressed while suppressing the snapback phenomenon. Specifically, by providing the n+ type dummy layer 3, the aspect ratio of the trench 42 is increased, and the grindstone is less prone to be curved at the upper part of the trench 42. Therefore, the contact between the grindstone and the p+ type collector layers 1 embedded in the trenches 42 can be suppressed, the suppression of the p+ type collector layers 1 from being removed by polishing is ensured. Therefore, the low resistance semiconductor device having the integrated structure of an IGBT and a MOSFET can be provided.

It should be noted that, in a case where at least one of the other configurations illustrated in the present specification is appropriately added to the configurations described above, that is, even in a case where the other configurations illustrated in the present specification which has not been referred to as the configurations described above are appropriately added, the same effect is produced.

Further, according to Embodiment described above, the width L1 of the n+ type dummy layer 3 in the first direction is narrower than the width L3 of the p+ type collector layer 1 in the first direction. According to such a configuration, by providing the n+ type dummy layer 3, the width of the p+ type collector layer 1 can be kept wide while suppressing the bending at the upper part of the trench 42 of the grindstone.

Further, according to Embodiment described above, the p+ type collector electrode 14 is brought into ohmic contact with the p+ type collector layers 1 via the p− type silicide layer 12. According to such a configuration, the IGBT operation capable of conductivity modulation is performed in the large current region.

Further, according to Embodiment described above, the semiconductor device includes first separation layers of the second conductive type between the n+ type dummy layers 3C and the p− type silicide layer 12. Here, the first separation layers correspond to, for example, the p− type separation layers 32C. According to such a configuration, the p− type separation layers 32C can be formed on the lower surfaces of the n+ type dummy layers 3C; therefore, the snapback phenomenon is suppressed with the arrangement of the n+ type dummy layers 3C.

Also, according to Embodiment described above, the n+ type dummy layers 3 are not brought into ohmic contact with the collector electrode 14. According to such a configuration, when a voltage is applied to the n+ type drain layers 2, no voltage is applied to the n+ type dummy layers 3, and from the n+ type dummy layers 3, no isoelectric lines that reduce the potential difference extend to the pn junctions of the p+ type collector layers 1. Accordingly, the snapback phenomenon is suppressed with the arrangement of the n+ type dummy layers 3.

Further, according to Embodiment described above, the semiconductor device includes the insulating layers 31 between the n+ type dummy layers 3C and the collector electrode 14. According to such a configuration, the ohmic contact between the n+ type dummy layers 3 and the collector electrode 14 is prevented.

Further, according to Embodiment described above, the semiconductor device includes second separation layers of the second conductive type between the n+ type dummy layers 3B and the n− type drift layer 4. Here, the second separation layers correspond to, for example, the p− type separation layers 32. According to such a configuration, the p− type separation layers 32 are provided between the n+ type dummy layer 3B and the n− type drift layer 4; therefore, the snapback phenomenon is suppressed with the arrangement of the n+ type dummy layers 3B. Therefore, the integrated structure of a low resistance IGBT and a MOSFET can be provided.

Further, according to Embodiment described above, the semiconductor device includes the n− type impurity layers 33 having an impurity concentration lower than that of the n+ type dummy layers 3D between the n+ type dummy layers 3D and the n− type drift layer 4. According to such a configuration, the depletion layer extends from the junction between the p+ type collector layer 1 and the n- type impurity layer 33, and the n- type impurity layer 33 is depleted. Accordingly, the snapback phenomenon is suppressed with the arrangement of the n+ type dummy layers 3D. Therefore, the integrated structure of a low resistance IGBT and a MOSFET can be provided.

Further, according to Embodiment described above, the n- type drift layer 4 is made of SiC. According to such a configuration, a low resistance semiconductor device is provided even in a semiconductor device to which SiC, which is more prone to cause a snapback phenomenon due to a large rising voltage, is applied.

According to Embodiments described above, a plurality of trenches 42 are formed on the upper surface of the n+ type semiconductor substrate 41 in the manufacturing method of the semiconductor device. First, a p- type impurity layer is deposited on the upper surface of the n+ type semiconductor substrate including inside of the plurality of trenches 42 by epitaxial growth. Then, the impurity layer formed in the region other than the inside of the trenches 42 is removed. Here, the impurity layers in the trenches 42 are p+ type collector layers 1, the n- type layers interposed between the plurality of trenches 42 are n+ type dummy layers 3, and the n- type layers on the outside of the trenches 42 are n+ type drain layers 2. And, the n- type drift layer 4 is formed on the upper surface of the n+ type semiconductor substrate 41 by epitaxial growth. Then, the lower surface of the n+ type semiconductor substrate 41 is removed until the p+ type collector layers 1 are exposed. Here, the width L1 of the n+ type dummy layer 3 in the first direction, which is the direction in which the dummy layers 3 are interposed between the plurality of p+ type collector layers 1, is narrower than the width L2 of the n+ type drain layer 2 in the first direction.

According to such a configuration, the removal of the p- type collector layer in the planarization process is suppressed while suppressing the snapback phenomenon. Specifically, by providing the n+ type dummy layer 3, the aspect ratio of the trench 42 is increased, and the grindstone is less prone to be curved at the upper part of the trench 42. Therefore, the contact between the grindstone and the p+ type collector layers 1 embedded in the trenches 42 can be suppressed, the suppression of the p+ type collector layers 1 from being removed by polishing is ensured. Therefore, the low resistance semiconductor device having the integrated structure of an IGBT and a MOSFET can be provided.

It should be noted that, in a case where at least one of the other configurations illustrated in the present specification is appropriately added to the configurations described above, that is, even in a case where the other configurations illustrated in the present specification which has not been referred to as the configurations described above are appropriately added, the same effect is produced.

Further, the order in which each process is performed can be changed, unless otherwise restricted.

Further, according to Embodiment described above, the p- type base layers 5 are formed on the upper surface of the n- type drift layer 4. And, the n- type source layer 6 is formed in the surface layer of the p- type base layer 5. Then, the gate insulating film 8 is formed, which is interposed between the n- type source layer 6 and the n- type drift layer 4 and is in contact with the p- type base layer 5. Then, the gate electrode 9 that comes into contact with the gate insulating film 8 is formed. Then, the interlayer insulating film 10 that covers the gate electrode 9 is formed. The emitter electrode 11 that covers the upper surfaces of the n- type source layers 6 and the interlayer insulating films 11 is formed. Then, the collector electrode 14 that is brought into ohmic contact with the p+ type collector layers 1 is formed. According to such a configuration, the removal of the p- type collector layer in the planarization process is suppressed while suppressing the snapback phenomenon.

Modification of Embodiments Described Above

Although in Embodiments described above, the qualities of materials of, materials of, dimensions of, shapes of, relative arrangement relationships, or conditions of implementation of each component may also be described, they are illustrative in all aspects and are not limited to those described herein.

Accordingly, it is understood that numerous other modifications variations, and equivalents can be devised without departing from the scope of the invention. For example, a case where modifying at least one component, a case where adding or omitting components, and further, a case where extracting at least one component in at least one embodiment and combining it with a component of another embodiment are included.

Further, "one or more" may be included as a component described as "one" in Embodiments described above, so far as consistent with Embodiments.

Furthermore, each component in Embodiments described above is a conceptual unit, and within the scope of the technology disclosed in the present specification, a case where one component is composed of a plurality of structures, a case where one component corresponds to a part of a structure, and further, a case where a plurality of components are provided in one structure are included.

Further, each component in Embodiments described above includes a structure having another structure or shape as long as the same function is exhibited.

Also, the descriptions in the present specification are referred for the every object related to the technique, and none of them are regarded as conventional techniques.

Further, in above-described Embodiments, when a material name or the like is described without being specified, the material contains other additives, for example, an alloy or the like, so far as consistent with Embodiments.

EXPLANATION OF REFERENCE SIGNS 1 p+ type collector layer, 2,2D n+ type drain layer, 3, 3B, 3C, 3D n+ type dummy layer, 4 n- type drift layer, 5 p- type base layer, 6 n- type source layer, 7 p- type base contact layer, 8 gate insulating film, 9 gate electrode, 10 interlayer insulating film, 11 emitter electrode, 12, 12A p- type silicide layer, 13 n- type silicide layer, 14 collector layer, 31 insulating layer, 32, 32C p- type separation layer, 33 n- type impurity layer, 41 n+ type semiconductor substrate, 42 trench, 43 mask, 51 active region, 52 terminal region, 61 structure group.

The invention claimed is:

1. A semiconductor device comprising:
a drift layer of first conductivity type;
a base layer of second conductivity type in a surface layer on an upper surface of the drift layer;
a source layer of the first conductivity type in a surface layer of the base layer;
a gate insulating film in contact with the base layer interposed between the source layer and the drift layer;
a gate electrode in contact with the gate insulating film;
an interlayer insulating film covering the gate electrode;

an emitter electrode covering an upper surface of the source layer and the interlayer insulating film;
a drain layer of the first conductivity type in a part of a lower surface of the drift layer;
a plurality of collector layers of the second conductivity type in parts of the lower surface of the drift layer;
a dummy layer of the first conductivity type interposed between the plurality of collector layers in parts of the lower surface of the drift layer; and
a collector electrode that is brought into ohmic contact with the collector layers via a first silicide layer of the second conductivity type, wherein
a width of the dummy layer in a first direction, which is a direction in which the dummy layer is interposed between the plurality of collector layers, is narrower than a width of the drain layer in the first direction.

2. The semiconductor device according to claim 1, wherein
the width of the dummy layer in the first direction is narrower than a width of the collector layers in the first direction.

3. The semiconductor device according to claim 1, further comprising
a first separation layer of the second conductivity type between the dummy layer and the first silicide layer.

4. The semiconductor device according to claim 1, wherein
the dummy layer is not brought into ohmic contact with the collector electrode.

5. The semiconductor device according to claim 1, further comprising
an insulating layer between the dummy layer and the collector electrode.

6. The semiconductor device according to claim 1, further comprising
a second separation layer of the second conductivity type between the dummy layer and the drift layer.

7. The semiconductor device according to claim 1, further comprising
an impurity layer of the first conductivity type between the dummy layer and the drift layer, having an impurity concentration lower than that of the dummy layer.

8. The semiconductor device according to claim 1, wherein
the drift layer is made of SiC.

9. A method of manufacturing a semiconductor device comprising:
forming a plurality of trenches on an upper surface of a semiconductor substrate of first conductivity type;
depositing an impurity layer of second conductivity type on the upper surface of the semiconductor substrate including inside of the plurality of trenches by epitaxial growth of the second conductivity type;
removing the impurity layer formed in the region other than the inside of the trenches, wherein
the impurity layers inside of the trenches represent collector layers, a layer of the first conductivity type interposed between the plurality of trenches represent a dummy layer, and a layer of the first conductivity type on outside of the trenches represent a drain layer;
forming a drift layer of the first conductivity type on an upper surface of the semiconductor substrate by epitaxial growth of the first conductivity type; and
removing a lower surface of the semiconductor substrate until the collector layers are exposed, wherein
a width of the dummy layer in a first direction, which is a direction in which the dummy layer is interposed between the plurality of collector layers, is narrower than a width of the drain layer in the first direction.

10. The method of manufacturing the semiconductor device according to claim 9, further comprising:
forming a base layer of the second conductivity type in a surface layer on an upper surface of the drift layer;
forming a source layer of the first conductivity type in a surface layer of the base layer;
forming a gate insulating film interposed between the source layer and the drift layer and in contact with the base layer;
forming a gate electrode in contact with the gate insulating film;
forming an interlayer insulating film covering the gate electrode;
forming an emitter electrode covering an upper surface of the source layer and the interlayer insulating film; and
forming a collector electrode that is brought into ohmic contact with the collector layers.

11. The method of manufacturing the semiconductor device according to claim 9, wherein
the width of the dummy layer in the first direction is narrower than a width of the collector layers in the first direction.

12. The method of manufacturing the semiconductor device according to claim 9, wherein
the drift layer is made of SiC.

13. The semiconductor device according to claim 1, wherein
the first silicide layer of the second conductivity type is on a lower surface of the plurality of collector layers and the dummy layer, and the semiconductor device further comprises:
a second silicide layer of the first conductivity type on a lower surface of the drain layer and interposed between portions of the first silicide layer in the first direction.

14. The semiconductor device according to claim 13, wherein
the first silicide layer and the second silicide layer are on an upper surface of the collector electrode.

15. The semiconductor device according to claim 3, wherein
the first separation layer contacts a lower surface of the dummy layer and an upper surface of the first silicide layer.

16. The semiconductor device according to claim 6, wherein
the second separation layer contacts an upper surface of the dummy layer and a lower surface of the drift layer.

* * * * *